(12) United States Patent
Drexler et al.

(10) Patent No.: US 8,081,478 B1
(45) Date of Patent: Dec. 20, 2011

(54) FLUID COOLED ELECTRONICS MODULE COVER

(75) Inventors: Gregory M. Drexler, Minnetonka, MN (US); Melissa A. Grette, Eagan, MN (US); Kevin J. Thorson, Eagan, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 114 days.

(21) Appl. No.: 12/330,819

(22) Filed: Dec. 9, 2008

(51) Int. Cl.
*H05K 5/00* (2006.01)
*H05K 7/20* (2006.01)
*H05K 7/00* (2006.01)
*H01L 23/34* (2006.01)
*F28D 15/00* (2006.01)

(52) U.S. Cl. ............ 361/728; 361/679.53; 361/699; 361/717; 165/104.33; 174/15.1; 257/712

(58) Field of Classification Search .......... 361/703, 361/689, 699, 717, 728, 679.53; 165/104.33; 257/712; 174/15.1
See application file for complete search history.

(56) References Cited

U.S. PATENT DOCUMENTS

| | | | | |
|---|---|---|---|---|
| 3,921,201 A * | 11/1975 | Eisele et al. | ................. | 257/714 |
| 4,962,444 A * | 10/1990 | Niggemann | ................. | 361/702 |
| 5,023,695 A * | 6/1991 | Umezawa et al. | ............. | 257/714 |
| 5,050,037 A * | 9/1991 | Yamamoto et al. | ............ | 361/699 |
| 5,126,829 A * | 6/1992 | Daikoku et al. | ................ | 257/713 |
| 5,157,588 A * | 10/1992 | Kim et al. | ...................... | 361/736 |
| 5,159,529 A * | 10/1992 | Lovgren et al. | ................ | 361/699 |
| 5,177,666 A * | 1/1993 | Bland et al. | .................... | 361/689 |
| 5,177,667 A * | 1/1993 | Graham et al. | ................ | 361/715 |
| 5,183,104 A * | 2/1993 | Novotny | ................... | 165/104.33 |
| 5,239,200 A * | 8/1993 | Messina et al. | ................. | 257/714 |
| 5,249,100 A * | 9/1993 | Satoh et al. | ..................... | 361/689 |
| 5,294,830 A * | 3/1994 | Young et al. | ................... | 257/714 |
| 5,323,292 A * | 6/1994 | Brzezinski | ...................... | 361/689 |
| 5,463,528 A * | 10/1995 | Umezawa | ...................... | 361/699 |
| 5,675,473 A * | 10/1997 | McDunn et al. | ................ | 361/699 |
| 5,705,850 A * | 1/1998 | Ashiwake et al. | ............. | 257/714 |
| 5,761,035 A * | 6/1998 | Beise | ............................ | 361/699 |
| 5,831,824 A * | 11/1998 | McDunn et al. | ............... | 361/699 |
| 5,841,634 A * | 11/1998 | Visser | ............................ | 361/699 |
| 5,978,220 A * | 11/1999 | Frey et al. | ...................... | 361/699 |
| 6,026,565 A * | 2/2000 | Giannatto et al. | .............. | 29/830 |
| 6,082,443 A * | 7/2000 | Yamamoto et al. | ....... | 165/104.26 |
| 6,236,566 B1 * | 5/2001 | Regnier et al. | ................. | 361/699 |
| 6,292,364 B1 * | 9/2001 | Fitzgerald et al. | ............ | 361/699 |
| 6,305,463 B1 * | 10/2001 | Salmonson | ................... | 165/80.3 |
| 6,351,384 B1 * | 2/2002 | Daikoku et al. | ............... | 361/704 |
| 6,366,462 B1 * | 4/2002 | Chu et al. | ....................... | 361/699 |
| 6,392,891 B1 * | 5/2002 | Tzlil et al. | ...................... | 361/719 |
| 6,535,386 B2 * | 3/2003 | Sathe et al. | ..................... | 361/700 |
| 6,578,626 B1 * | 6/2003 | Calaman et al. | .............. | 165/80.4 |
| 6,594,149 B2 * | 7/2003 | Yamada et al. | ............... | 361/699 |
| 6,621,706 B2 * | 9/2003 | Tzlil et al. | ...................... | 361/719 |
| 6,661,658 B2 * | 12/2003 | Capriz et al. | ................... | 361/690 |
| 6,662,859 B2 * | 12/2003 | Strahle et al. | ............. | 165/104.13 |

(Continued)

*Primary Examiner* — Bradley Thomas
(74) *Attorney, Agent, or Firm* — Hamre, Schumann, Mueller & Larson, P.C.

(57) ABSTRACT

An electronics component assembly for cooling high power density components including a fluid cooled module cover. In one embodiment, the electronics component assembly includes a module cover that is configured to make thermal contact with heat-generating electronic components of a module. The module cover includes an inlet, an outlet and at least one fluid passageway between the inlet and the outlet. The fluid passageway permits fluid to flow through the module cover, thereby allowing the module cover to act as a heat sink.

19 Claims, 5 Drawing Sheets

U.S. PATENT DOCUMENTS

| | | | | |
|---|---|---|---|---|
| 6,719,039 B2* | 4/2004 | Calaman et al. | | 165/80.4 |
| 6,721,181 B1* | 4/2004 | Pfeifer et al. | | 361/704 |
| 6,882,533 B2* | 4/2005 | Bash et al. | | 361/696 |
| 6,935,412 B2* | 8/2005 | Mueller | | 165/80.4 |
| 6,942,019 B2* | 9/2005 | Pikovsky et al. | | 165/80.4 |
| 6,986,382 B2* | 1/2006 | Upadhya et al. | | 165/80.4 |
| 6,988,534 B2* | 1/2006 | Kenny et al. | | 165/80.4 |
| 6,992,382 B2* | 1/2006 | Chrysler et al. | | 257/717 |
| 7,035,104 B2* | 4/2006 | Meyer | | 361/700 |
| 7,040,383 B2* | 5/2006 | Oyamada | | 165/104.33 |
| 7,262,966 B2* | 8/2007 | Liao | | 361/699 |
| 7,352,581 B2* | 4/2008 | Tomioka | | 361/702 |
| 7,372,697 B2* | 5/2008 | Tomioka | | 361/699 |
| 7,417,857 B2* | 8/2008 | Rondier et al. | | 361/699 |
| 7,450,384 B2* | 11/2008 | Tavassoli et al. | | 361/699 |
| 7,460,367 B2* | 12/2008 | Tracewell et al. | | 361/679.48 |
| 7,486,518 B2* | 2/2009 | Tomioka | | 361/718 |
| 7,602,610 B2* | 10/2009 | Ueda | | 361/701 |
| 7,652,885 B2* | 1/2010 | Tomioka | | 361/700 |
| 7,830,664 B2* | 11/2010 | Campbell et al. | | 361/699 |
| 2002/0067598 A1* | 6/2002 | Sathe et al. | | 361/700 |
| 2003/0178179 A1* | 9/2003 | Brost | | 165/80.2 |
| 2004/0012914 A1* | 1/2004 | Chu et al. | | 361/679 |
| 2004/0069451 A1* | 4/2004 | Meyer | | 165/80.2 |
| 2006/0096738 A1* | 5/2006 | Kang et al. | | 165/80.4 |
| 2006/0232939 A1* | 10/2006 | Inoue | | 361/704 |
| 2007/0091569 A1* | 4/2007 | Campbell et al. | | 361/699 |
| 2007/0097627 A1* | 5/2007 | Taylor et al. | | 361/689 |
| 2008/0264604 A1* | 10/2008 | Campbell et al. | | 165/80.4 |
| 2008/0315403 A1* | 12/2008 | Andry et al. | | 257/713 |
| 2009/0040726 A1* | 2/2009 | Hoffman et al. | | 361/700 |
| 2009/0219695 A1* | 9/2009 | Tomioka | | 361/700 |

* cited by examiner

FLUID COOLED ELECTRONICS MODULE COVER

FIELD

This disclosure relates generally to cooling of electronic components, and more particularly to cooling of electronic components using fluid flowing through an electronics module cover.

BACKGROUND

Electronic chassis assemblies that generally contain multiple electronics module assemblies made up of circuit card assemblies are known. Such chassis assemblies are used in, for example, military and aircraft applications that may involve harsh environments. Electronic chassis assemblies for such uses can be designed to operate reliably by increasing the ruggedness of the components and/or structure of the assemblies. One way to protect operational reliability and optimize performance is to utilize a system thermal design that manages the significant amount of heat generated by electronic components mounted on circuit cards when operating at high power densities.

There are a variety of known thermal management systems. In some systems, conduction cooling may be used, for example, for up to 200 watts module heat generation. Airflow-through cooling may be used, for example, for up to 250 watts of module heat generation. Liquid-flow-through cooling may be used, for example, for up to 1000 watts heat generation. These particular thresholds are based on the thermal management system providing a cooling supply to transport the heat to an environmental control system (ECS) using flow materials including air, water, water/alcohol mixtures, and synthetic oils such as poly alpha olefin. The ECS capacity sets the overall system cooling limit. However, electronic modules may be trending toward higher speed and higher performance and generating larger amounts of heat and greater power densities.

It is known to provide a conduction cooled circuit card module where heat generated by the electronic components is absorbed by a thermally conductive cover, forwarded to a module frame and transferred to a module frame-wedge lock interface. The module frame-wedge lock interface functions to dissipate the heat through a chassis rail to which the circuit card modules are mounted. For modern electronic components, the power dissipation values have increased the module power dissipation requirement to the limit of the conduction cooled module frame capacity. Thus, there is a need for a more effective cooling mechanism in order to dissipate such high amounts of heat.

SUMMARY

An electronics component assembly configured to fluid cool high power density components is described. The disclosed electronics component assembly is configured to minimize the thermal resistance path from the heat-generating electronics components to a heat dissipation device, commonly referred to as a heat sink, by providing cooling fluid as close as possible to the heat-generating electronic components.

In one embodiment, the disclosed electronics component assembly includes a top module cover that is configured to make thermal contact with at least one heat-generating electronic component of a module. The module cover includes an inlet, an outlet and at least one fluid passageway, preferably a plurality of fluid passageways. The fluid passageway permits fluid to flow through the module cover, thereby allowing the module cover to act as an active heat sink. This provides a shorter thermal path from the heat generating component to the active heat sink.

In another embodiment, the module cover further includes a volume that is interconnected to or in fluid communication with the fluid passageway. The volume is configured such that it is positioned adjacent to the top of the heat-generating component. In one example, a network of fluid passageways is formed by the interconnected fluid passageway and the volume so as to allow the fluid to pass between the inlet, the volume and the outlet.

In one implementation, a cooling fin assembly is located adjacent to the top of the heat-generating component. With this configuration, additional cooling can be provided by dissipating the heat transferred to the fluid through the cooling fins.

In another implementation, nozzles spray fluid into the volume from the fluid passageway.

In yet another embodiment, the disclosed electronics component assembly further includes a bottom module cover. The bottom module cover is configured to make thermal contact with at least one heat-generating electronic component on the bottom side of the module. In this embodiment, fluid first flows through the fluid passageway of the top module cover and then to the bottom module cover via a tube provided on the bottom module cover. The fluid then flows through the bottom module cover, and then returns to the top module cover via another tube provided on the bottom module cover.

DETAILED DESCRIPTION

An electronics component assembly configured to fluid cool high power density components. The disclosed electronics component assembly includes a module cover and a module. The module cover, which is configured to make thermal contact with one or more heat-generating electronic components on the module, includes fluid passageways. The fluid passageways permit cooling fluid to flow through the module cover, thereby allowing the module cover to act as a heat sink.

In the following exemplary embodiments, various cooling fluids in various states may be used, including liquids such as water or oils. One example of a suitable fluid is 3M's Flourinert™.

In addition, the fluid passageways may be employed in a number of configurations and arrangements to accomplish the cooling of various components on the module.

Figure 1:
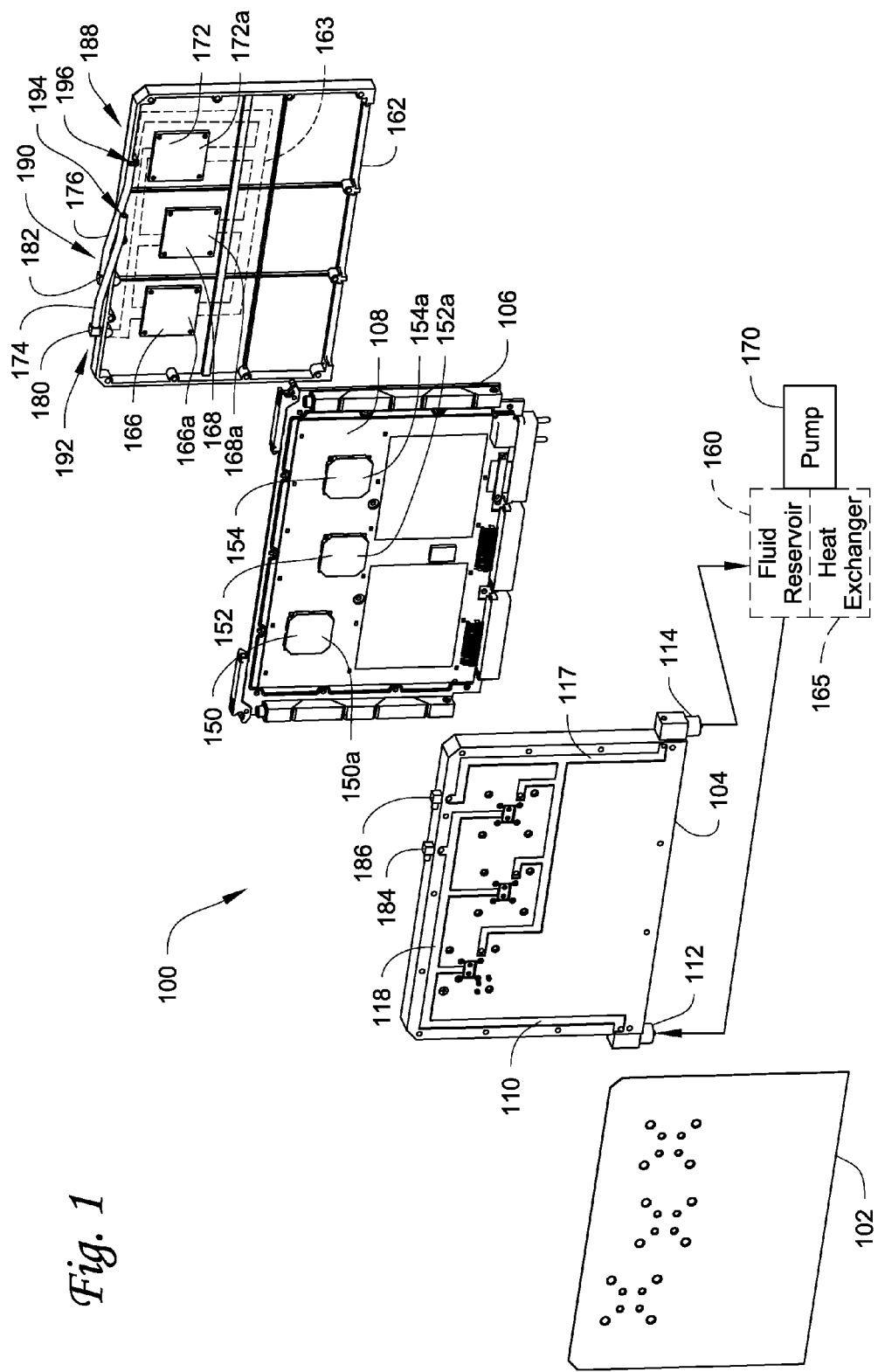
FIG. 1 shows one embodiment of an electronics module assembly utilizing spray nozzles.

With reference to FIG. 1, an embodiment of an electronics module assembly 100 for cooling heat-generating components is illustrated. The electronics module assembly 100 includes a module 106 having heat-generating electronic components 150, 152, 154 on a front surface 108 of the module 106. In one example, the module 106 includes a pair of circuit cards supported by a module frame, where heat generating components are disposed on a surface of the circuit cards. Examples of heat-generating electronic components include integrated circuits, microprocessors, or any electronic component that generates heat. In the embodiment shown in FIG. 1, the components 150, 152, 154 are microprocessor chips.

The electronics module assembly 100 further includes a front module cover 104 and a top 102 for the module cover 104. The material used for the module cover 104 and the top 102 is not particularly limited, and is preferably a thermally conductive material, for example a metal such as aluminum, copper, etc.

Figure 2:
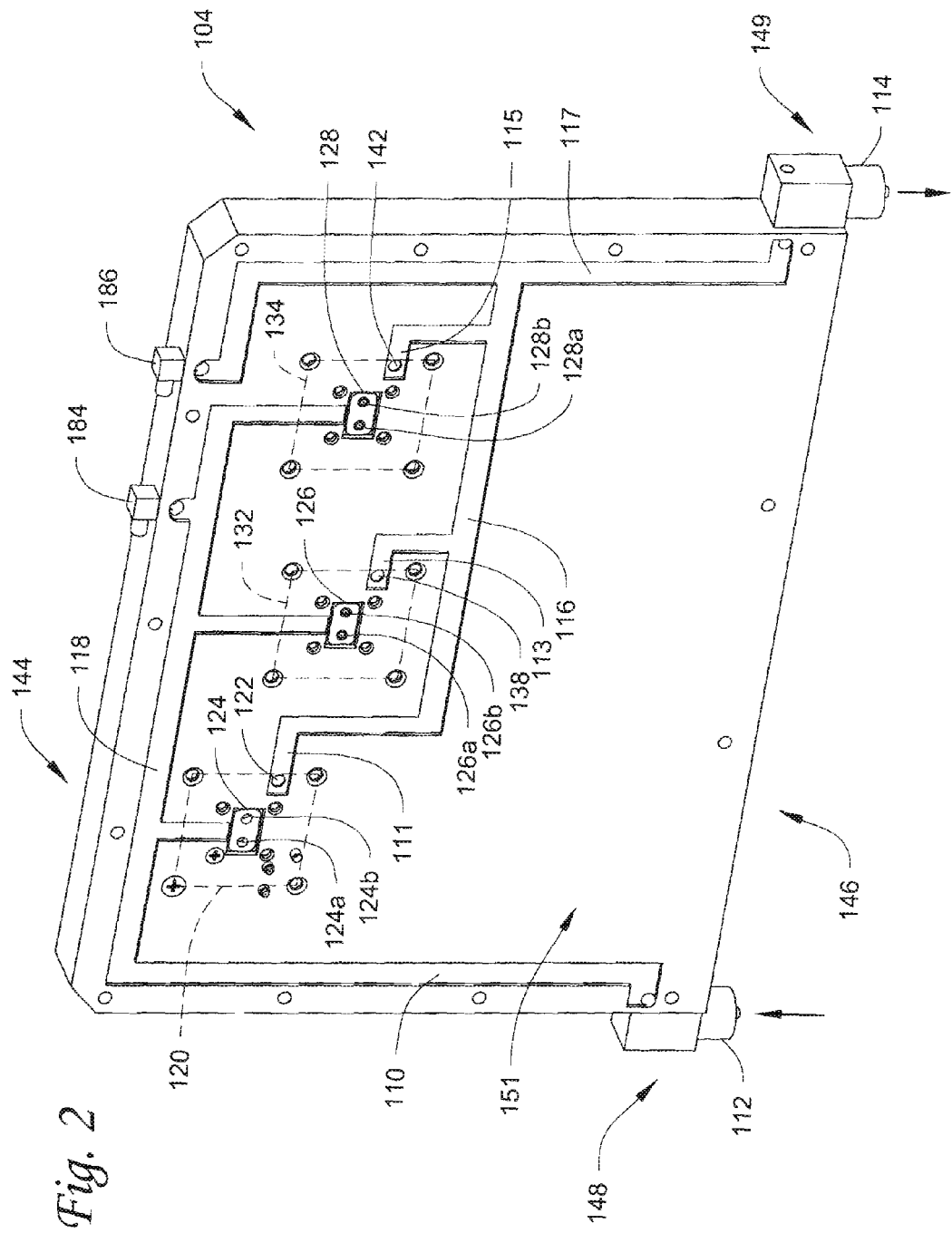
FIG. 2 shows one embodiment of a module cover included in FIG. 1 utilizing spray nozzles.

Referring to FIGS. 1 and 2, the module cover 104 includes a fluid inlet 112 and a fluid outlet 114. The inlet 112 is provided on a first corner end 148 of the module cover 104. The outlet 114 is provided on a second corner end 149 of the module cover 104.

The module cover 104 further includes a fluid passageway 110. The inlet 112 and outlet 114 are interconnected with the fluid passageway 110. The fluid passageway 110 is provided in a top surface 151 of the module cover 104. FIG. 2 shows the fluid passageway 110 as a recessed channel having a constant depth. However, it is to be realized that the depth of the fluid passageway 110 is not particularly limited, and in appropriate circumstances, the fluid passageway 110 can have variable depths.

As shown in FIG. 2, the fluid passageway 110 leads to terminals 124, 126, 128, which are trenched regions having depth and are interconnected with the fluid passageway 110. The terminal 124 provides a housing for nozzles 124a, 124b, the terminal 126 provides a housing for nozzles 126a, 126b and the terminal 128 provides a housing for nozzles 128a, 128b. The nozzles 124a, 124b, 126a, 126b, 128a, 128b are configured to spray fluid into volumes 120, 132, 134 (shown in dashed lines). FIG. 1 shows three terminals with each terminal having two nozzle openings. However, the number of terminals or nozzles used is not particularly limited.

The terminals 124, 126, 128 are interconnected with the volumes 120, 132, 134, respectively through the nozzles 124a, 124b, 126a, 126b, 128a, 128b. The volumes 120, 132, 134 are recessed cavities having depth, and are provided on a back surface (not shown) of the module cover 104. The volumes 120, 132, 134 have the same structure as that of volumes 166, 168, 172 of a back module cover 162 as shown in FIG. 1. The volumes 166, 168, 172 have respective bottom surfaces 166a, 168a, 172a configured to make thermal contact with heat-generating components (not shown) on a back surface (not shown) of the module 106. Similarly, the volumes 120, 132, 134 have bottom surfaces (not shown) configured to make thermal contact with the heat-generating components 150, 152, 154. In one embodiment, thermal contact means that there is actual physical contact between the heat generating components and the volumes. However, in appropriate circumstances, thermal contact could mean any arrangement where heat exchange occurs between the volumes and the heat generating components.

FIGS. 1 and 2 show three volumes and the shape of the volumes 120, 132, 134 as corresponding to the rectangular shapes of the heat-generating components 150, 152, 154. However, the depth and shape of the volumes 120, 132, 134 and the number of volumes employed are not particularly limited.

The module cover 104 also includes ports 122, 138, 142. The ports 122, 138, 142 are provided within fluid passageways 111, 113, 115, respectively, and allow interconnection between the volumes 120, 132, 134 and the respective fluid passageways 111, 113, 115.

The fluid passageways 111, 113, 115 are interconnected with a fluid passageway 117 via a common fluid passageway 116. The fluid passageway 117 leads to and is interconnected with the fluid outlet 114.

In one embodiment, the electronics module assembly 100 is assembled by mating the module cover 104 with the module 106 such that the bottom surfaces of the volumes 120, 132, 134 are in thermal contact with top surfaces 150a, 152a, 154a of the heat-generating components 150, 152, 154, respectively. The top 102 is provided on the module cover 104 so as to seal the module cover 104 and close the fluid passageways 110, 111, 113, 115, 117. The top 102 may be attached to the module cover 104 by any attachment method, for example, screws, brazing, soldering, etc.

Figure 3:
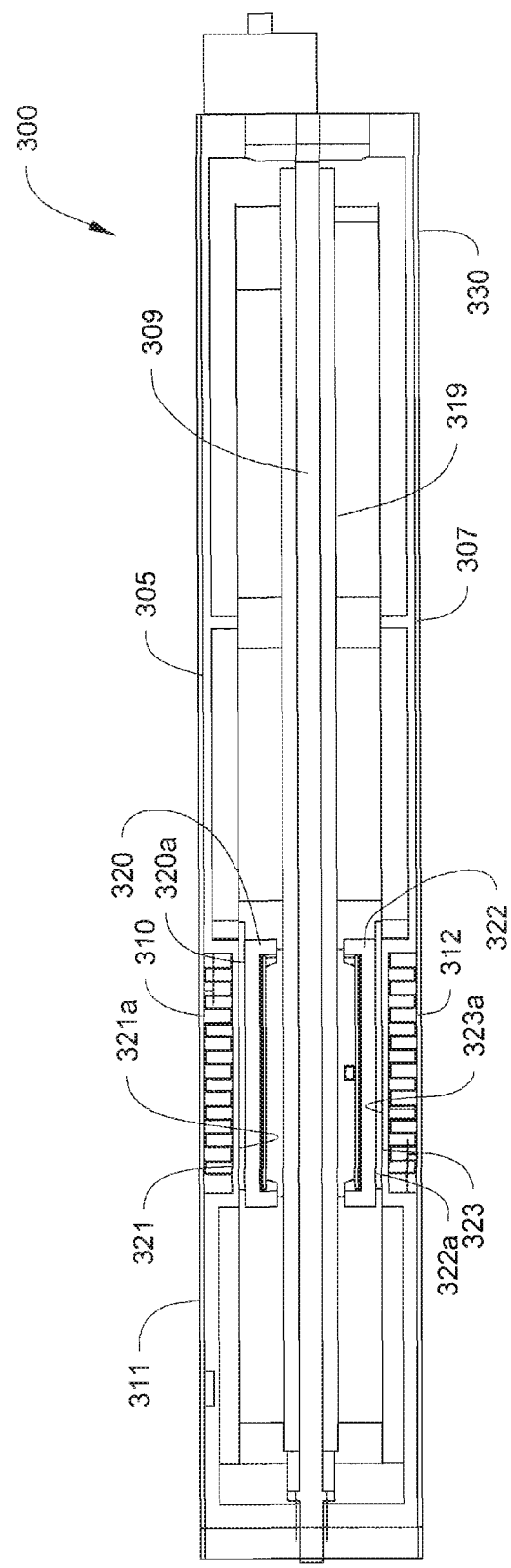
FIG. 3 shows a side view of another embodiment of the disclosed electronics component assembly utilizing non-sprayed liquid flow.

The assembled electronics module assembly 100 has an assembled configuration similar to that of an electronics module assembly 300 shown in FIG. 3. FIG. 3 shows a front module cover 305 having a volume 321 where the cover 305 is mated with a module 309 having a heat generating component 320 such as a microprocessor chip. A top 311 is provided on the module cover 305. FIG. 3 also shows a bottom surface 321a of the volume 321 that is in direct thermal contact with a surface 320a of the heat generating component 320.

Returning to FIGS. 1 and 2, during operation, fluid is pumped by a pump 170 from a fluid reservoir 160 to the inlet 112 of the module cover 104. The fluid then flows from the inlet 112 into the fluid passageway 110.

The fluid then flows to the terminals 124, 126, 128 via a header passageway 118. The header passageway 118 provides simultaneous feeding of cooling fluid to the terminals. Once reaching the terminals 124, 126, 128, the fluid is sprayed into the volumes 120, 132, 134 through the respective nozzles 124a, 124b, 126a, 126b, 128a, 128b. The fluid that is sprayed into the volumes 120, 132, 134 functions to cool the heat-generating components at the bottom surfaces of the volumes 120, 132, 134 by absorbing heat that is transferred to the bottom surfaces. In one example, a two-phase cooling is achieved, where the bottom surfaces are hot enough to vaporize the fluid. In one implementation, the fluid boiling point is tailored to a predetermined temperature range. Once the fluid is drawn out, for example by vapor pressure or gravity, the fluid exits out of the volumes 120, 132, 134 through the respective ports 122, 138, 142 to the respective fluid passageways 111, 113, 115 and to the passageway 116. The fluid then flows to the fluid passageway 117, then to the outlet 114, and back to the fluid reservoir 160 where the fluid is cooled by a heat exchanger 165.

In another embodiment, the electronics module assembly 100 further includes a back module cover 162. The configuration of the back module cover 162 is similar to the front module cover 104 including the presence of fluid passageways similar to those of the front module cover 104, the volumes 166, 168, 172, terminals (not shown) with nozzles (not shown) and ports (not shown). The fluid passageways, the volumes 166, 168, 172, the terminals, the nozzles and the ports of the back module cover 162 are interconnected in a similar manner to that of the front module cover 104. A parallel fluid passageway 163 for the cover 162 is illustrated in dashed lines in FIG. 1.

The back module cover 162 further includes a fluid inlet port 180 that is interconnected with the fluid passageways in the back module cover 162. The inlet port 180 is attached to a first end 192 of a first tube 174, the first tube 174 being provided on a top side 188 of the back module cover 162. A second end 194 of the first tube 174 is configured to be attachable to a fluid outlet port 184 of the front module cover 104. The outlet port 184 is interconnected with the header passageway 118 in the front module cover 104. Thus, cooling fluid in the heading passageway 118 can flow to the module cover 162 via the outlet port 184, the tube 174 and the inlet port 180.

The back module cover 162 further includes a fluid outlet port 182 that is interconnected with the fluid passageways in the back module cover 162. The outlet port 182 is attached to a first end 190 of a second tube 176, the second tube 176 being provided on the top side 188 of the back module cover 162. A second end 196 of the second tube 176 is configured to be attachable to a fluid port 186 of the front module cover 104. The port 186 is interconnected with the fluid passageway 117 in the front module cover 104. Thus, cooling fluid from the back cover 162 can flow to the front module cover 104 via the port 182, the tube 176 and the port 186.

In the embodiment where the electronics module assembly 100 includes the back module cover 162, the electronics module assembly 100 is assembled by mating the back module cover 162 with the back surface of the module 106 such that the volumes 166, 168, 172 are in thermal contact with the heat-generating components (not shown) on the back surface of the module 106. In the assembled form of the electronics module assembly 100, the second end 194 of the first tube 174 is connected to the outlet port 184 and the second end 196 of the second tube 176 is connected to the inlet port 186.

The assembled electronics module assembly 100 including the back cover 162 has an assembled configuration similar to that of the electronics module assembly 300 shown in FIG. 3. FIG. 3 further shows a back module cover 307 having a volume 323, where the cover 307 is mated with the module 309 having a heat generating component 322 on a back surface 319 of the module 309. A top 330 is provided on the module cover 307. FIG. 3 also shows a bottom surface 323a of the volume 323 that is in thermal contact with a surface 322a of the heat generating component 322.

In FIG. 3, the front and back module covers 305, 307 can include fluid passageways (not shown) similar to those of the front module cover 104 and back module cover 162 shown in FIGS. 1 and 2. The electronics module assembly 300 further includes cooling fin assemblies 310, 312, respectively, disposed within the volumes 321, 323. The cooling fin assemblies 310, 312 include a number of cooling fins to increase the surface area for heat transfer. The cooling fin assemblies 310, 312 can be fixed in any suitable manner to the modules covers 305, 307, for example by brazing the assemblies to the volumes 321, 323 and to the tops 311, 330. With this configuration, heat is transferred by conduction to the fins of the fin assemblies, and the fluid contacts the fin surfaces to transfer the heat to the fluid.

Figure 4:
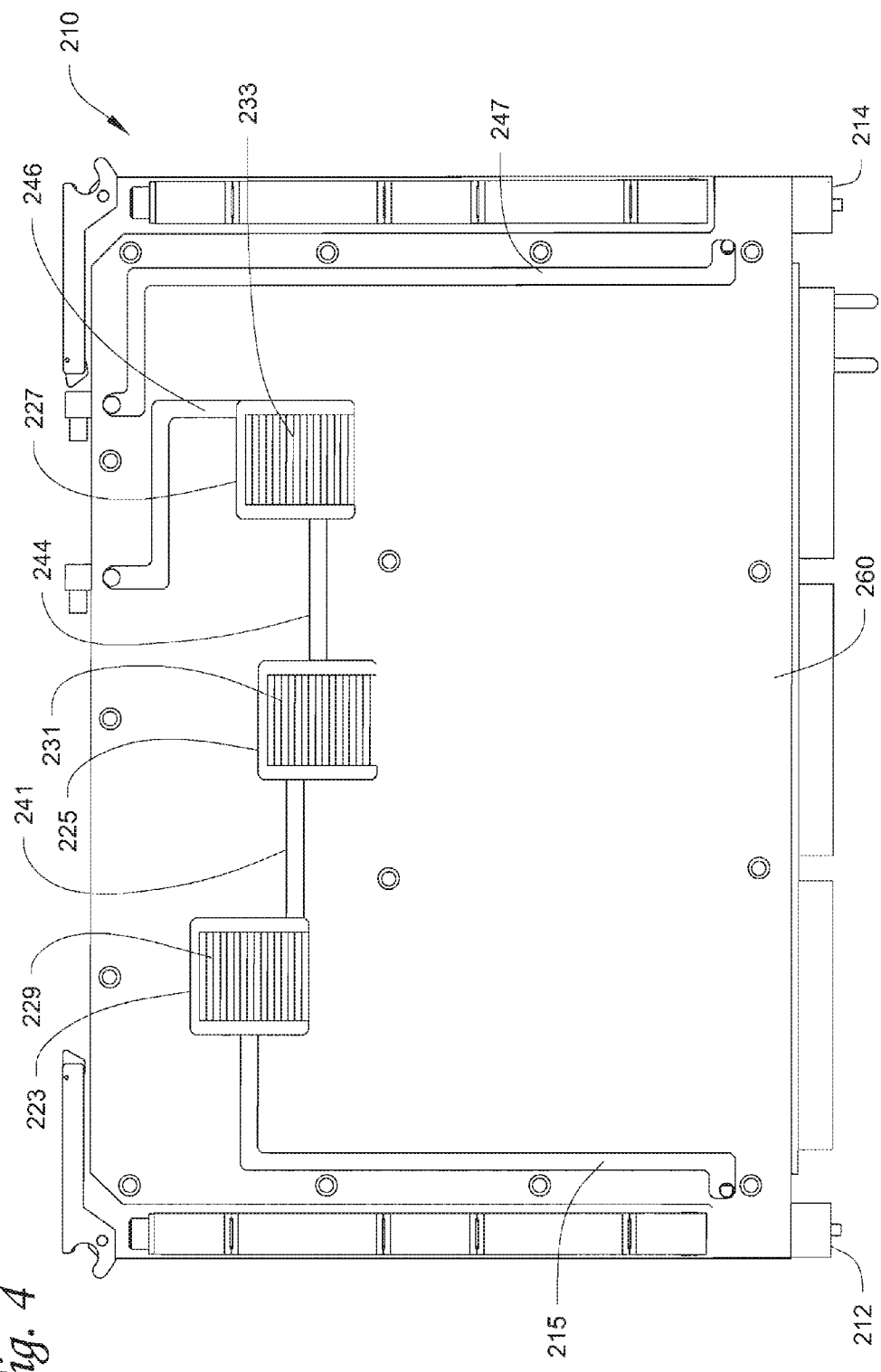
FIG. 4 shows one embodiment of a module cover utilizing non-sprayed serial path liquid flow.

FIG. 4 shows another embodiment of a module cover 210. The module cover 210 includes a module fluid inlet 212, a module fluid outlet 214, volumes 223, 225, 227, and fluid passageways 215, 241, 244, 246, 247 having a similar configuration to those shown in FIG. 2. However, the module cover 210 does not have nozzles and the flow path of the fluid passageways 215, 241, 244, 246 is a serial flow path.

In particular, in this embodiment, the fluid passageway 215 is interconnected with the module fluid inlet 212 and the volume 223, the fluid passageway 241 is interconnected with the volumes 223, 225, the fluid passageway 244 is interconnected with the volumes 225, 227, the fluid passageway 246 is interconnected with the volume 227 and an outlet port (not shown), and fluid passageway 247 is interconnected with an inlet port (not shown) and the module fluid outlet 214.

The module cover 210 further includes cooling fin assemblies 229, 231, 233 disposed within the volumes 223, 225, 227, respectively. In this example, the fluid first flows from the module inlet 212 into the fluid passageway 215. The fluid then flows over the cooling fin assembly 229 within the volume 223. Once the fluid is drawn out by fluid pressure, the fluid then flows into the fluid passageway 241. The fluid then flows over the cooling fin assemblies 231, 233 within the respective volumes 225, 227 in a similar manner. Once the fluid is drawn out, the fluid flows into the respective fluid passageways 244 and 246. The fluid then flows out through the outlet port. In one example, the fluid flows to the back module cover 162 and returns through the inlet port in a similar manner as described above. The fluid then flows to the fluid passageway 247, and then to the module fluid outlet 214.

The fluid passageways 215, 241, 244, 246, 247 described in FIG. 4 illustrate a serial flow path for the cooling path as indicated above. However, in appropriate circumstances, the module cover 210 may have a parallel flow path similar to the fluid passageways 110, 111, 113, 115, 117 described in FIG. 1. In the case of FIG. 4, the fluid passageways between the module fluid inlet 212 and the module fluid outlet 214 are completely fluid filled.

Figure 5:
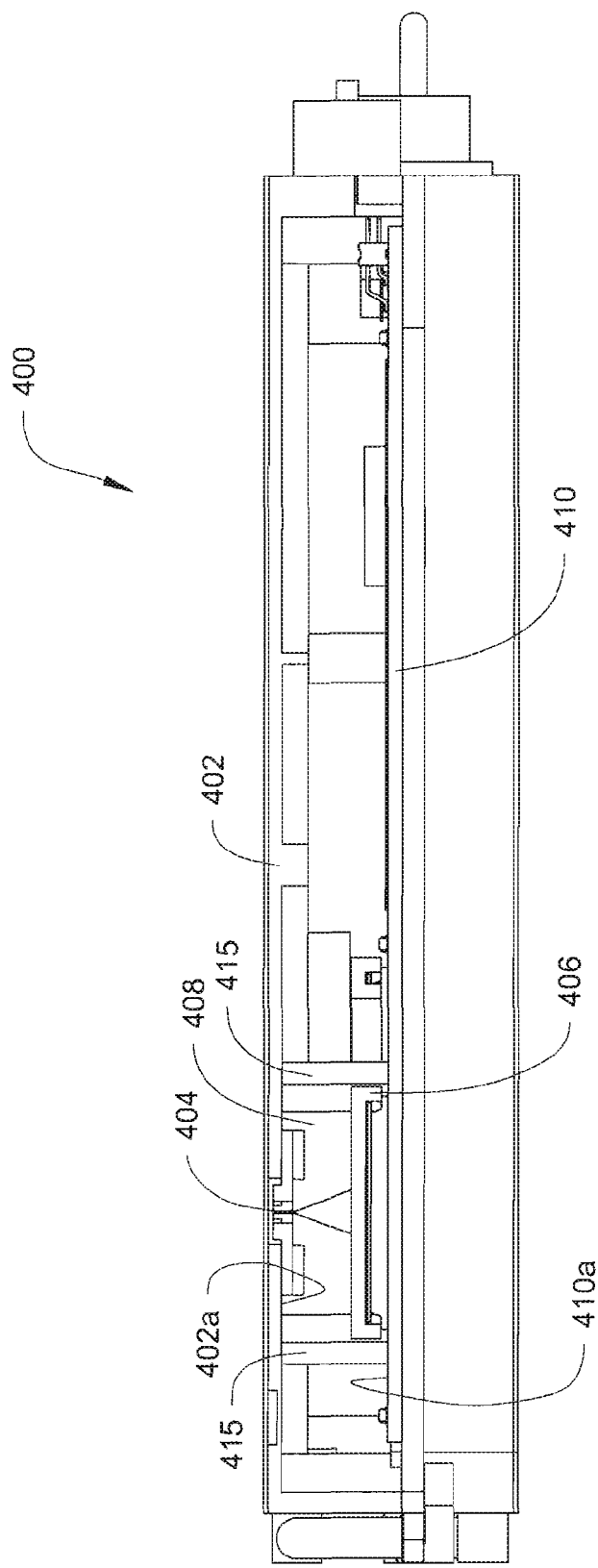
FIG. 5 shows a side view of another embodiment of the disclosed electronics component assembly utilizing spray nozzles.

FIG. 5 shows a side view of yet another embodiment of an assembled electronics module assembly 400. The electronics module assembly 400 includes a module cover 402 and a module 410 having a heat generating component 406. The module cover 402 includes fluid passageways (not shown) similar to the fluid passageways 110, 111, 113, 115, 117 shown in FIG. 2. The module cover further includes a nozzle 404. The nozzle 404 is interconnected with the fluid passageways. The module cover 402 also includes a wall 415 that is attached to a surface 402a of the module cover 402. The wall 415 extends from the surface 402a and is sealed to a surface 410a of the module 410. The wall 415 surrounds the heat generating component 406 so as to create a sealed volume 408. The nozzle 404 is configured to spray fluid into the sealed volume 408 and directly onto the heat generating component 406.

While the disclosed electronics component assembly has been described in conjunction with illustrated embodiments, it will be obvious to one skilled in the art that other embodiments of the disclosed electronics component assembly may be made within the purview and scope of the disclosure. The disclosed embodiments and details are not to be taken as limitations on the claims.

What is claimed is:

1. An electronics module assembly comprising:
a module having a first surface with at least one heat generating electronic component on the first surface, the electronic component including an upper surface, and
a first module cover having at least one enclosed cooling volume that is disposed adjacent to the heat generating electronic component, the enclosed cooling volume includes a wall that extends from the first module cover toward the heat generating electronic component, a bottom wall connected to an end of the wall and positioned to be disposed adjacent to the heat generating electronic component, and an upper wall spaced from the bottom wall and disposed generally parallel thereto, the wall, the bottom wall and the upper wall define an interior space of the enclosed cooling volume, the bottom wall is disposed between the upper wall and the upper surface of the heat generating electronic component, the bottom wall extends parallel to the first surface and is generally parallel to the upper surface of the electronic component in heat exchange relationship with the upper surface, and a cooling fluid inlet port and a cooling fluid exit port formed in the upper wall and in communication with the interior space of the enclosed cooling volume, and the enclosed cooling volume is configured such that a cooling fluid introduced into the enclosed cooling volume does not directly contact the heat generating electronic component;

the first module cover further including:

an inlet through which the cooling fluid can enter the first module cover;

an outlet through which the cooling fluid can exit the first module cover; and a network of fluid passageways which allows the fluid to pass between the inlet, the enclosed cooling volume for cooling the heat generating electronic component and the outlet;

and the module has a second surface with at least one heat generating electronic component on the second surface, the electronic component on the second surface including an upper surface, and further comprising a second module cover having at least one enclosed cooling volume that is disposed adjacent to the heat generating electronic component on the second surface, the enclosed cooling volume of the second module cover includes a second wall that extends from the second module cover toward the heat generating electronic component on the second surface, a second bottom wall connected to an end of the second wall and positioned to be disposed adjacent to the heat generating electronic component on the second surface, and a second upper wall spaced from the second bottom wall and disposed generally parallel thereto, the second wall, the second bottom wall and the second upper wall define an interior space of the enclosed cooling volume of the second module cover, the second bottom wall is disposed between the second upper wall and the heat generating electronic component on the second surface, the second bottom wall extends parallel to the second surface and is generally parallel to the upper surface of the electronic component on the second surface in heat exchange relationship therewith, and a cooling fluid inlet port and a cooling fluid exit port formed in the second upper wall and in communication with the interior space of the enclosed cooling volume of the second module cover, wherein the enclosed cooling volume of the second module cover is configured such that the cooling fluid introduced into the enclosed cooling volume of the second module cover does not directly contact the heat generating electronic component on the second surface;

the second module cover further including an inlet port interconnected with the network of fluid passageways of the first module cover that receives the cooling fluid from the first module cover;

an outlet port interconnected with the network of fluid passageways of the first module cover that exhausts the cooling fluid back to the first module cover; and a fluid passageway interconnected with the inlet port, the outlet port and the enclosed cooling volume of the second module cover to allow the cooling fluid received from the first module cover to flow from the inlet port to the outlet port through the enclosed cooling volume of the second module cover for cooling the heat generating electronic component on the second surface.

2. The electronics module assembly of claim 1, wherein the first module cover further comprises:

at least one terminal formed in the upper wall adjacent the enclosed cooling volume, the at least one terminal being interconnected with the network of fluid passageways and with the enclosed cooling volume, the at least one terminal is interconnected with the enclosed cooling volume via the cooling fluid inlet port.

3. The electronics module assembly of claim 2, wherein the cooling fluid inlet port of the enclosed cooling volume of the first module cover includes at least one nozzle located in the at least one terminal, the at least one nozzle configured to spray the cooling fluid into the enclosed cooling volume.

4. The electronics module assembly of claim 1, wherein the at least one heat generating electronic component on the first surface includes a plurality of heat generating electronic components on the first surface, the first module cover comprises a plurality of the enclosed cooling volumes, with each of the enclosed cooling volumes disposed adjacent to a respective one of the heat generating electronic components with the bottom wall of each enclosed volume in heat exchange relationship with the respective heat generating electronic component, and the network of fluid passageways is interconnected with each of the enclosed cooling volumes.

5. The electronics module assembly of claim 4, wherein each of the enclosed cooling volumes of the first module cover are interconnected by the network of cooling fluid passageways such that the cooling fluid flows to each of the enclosed cooling volumes in a parallel flow path.

6. The electronics module assembly of claim 4, wherein each of the enclosed cooling volumes of the first module cover are interconnected by the network of cooling fluid passageways such that the cooling fluid flows to each of the enclosed cooling volumes in a serial flow path.

7. The electronics module assembly of claim 1, further comprising a cooling fin assembly disposed within the enclosed cooling volume of the first module cover.

8. The electronics module assembly of claim 1, wherein the second module cover further comprises:

at least one terminal formed in the second upper wall adjacent the enclosed cooling volume of the second module cover, the at least one terminal being interconnected with the fluid passageway of the second module cover and with the enclosed cooling volume thereof.

9. The electronics module assembly of claim 1, wherein the at least one heat generating electronic component of the second surface includes a plurality of heat generating electronic components thereon, and the second module cover comprises a plurality of the enclosed cooling volumes, with each of the enclosed cooling volumes disposed adjacent to a respective one of the heat generating electronic components with the second bottom wall of each enclosed cooling volume in heat exchange relationship with the respective heat generating electronic component; and the fluid passageway of the second module cover is interconnected with each of the enclosed cooling volumes of the second module cover.

10. The electronics module assembly of claim 1, further comprising a cooling fin assembly disposed within the enclosed cooling volume of the second module cover.

11. The electronics module assembly of claim 1, wherein the electronics module assembly is configured so that the cooling liquid can be drawn out of the enclosed cooling volumes of the first and second module covers via the exit port by vapor pressure.

12. The electronics module assembly of claim 1, wherein there is direct physical contact between the bottom wall of the enclosed cooling volume of the first module cover and the upper surface of the electronic component on the first surface, or the bottom wall is indirectly connected to the upper surface.

13. The electronics module assembly of claim 1, wherein the inlet is at a first end of the first module cover and the outlet is at a second end of the first module cover opposite the first end.

14. The electronics module assembly of claim 1, wherein the upper surface of the electronic component on the first surface is disposed between the bottom wall of the enclosed cooling volume of the first module cover and the first surface.

15. An electronics module assembly comprising:
a module having a first surface and a second surface, the first and second surfaces face in opposite directions;
a plurality of first heat generating electronic components on the first surface, and a plurality of second heat generating electronic components on the second surface;
a first module cover configured to cover the first surface of the module, the first module cover includes a plurality of first enclosed cooling volumes, each first enclosed cooling volume being disposed adjacent to a respective one of the first heat generating electronic components; each of the first enclosed cooling volumes includes an interior space defined by an upper wall, a side wall that extends from the upper wall toward the respective first heat generating electronic component, and a bottom wall connected to an end of the side wall and positioned to be disposed adjacent to the respective first heat generating electronic component so as to be in heat exchange relationship therewith; the bottom wall is spaced from and generally parallel to the upper wall, and each of the first enclosed cooling volumes includes a cooling fluid inlet port and a cooling fluid exit port;
the first module cover further including:
an inlet through which cooling fluid can enter the first module cover;
an outlet through which the cooling fluid can exit the first module cover;
a cooling fluid inlet header passageway fluidly connected to the inlet and in simultaneous fluid communication with the cooling fluid inlet ports of the first enclosed cooling volumes;
a cooling fluid outlet header passageway fluidly connected to the outlet and in simultaneous fluid communication with the cooling fluid exit ports of the first enclosed cooling volumes;
a transfer outlet port in fluid communication with the cooling fluid inlet header passageway; and
a transfer inlet port in fluid communication with the cooling fluid outlet header passageway;
a second module cover configured to cover the second surface of the module, the second module cover includes a plurality of second enclosed cooling volumes, each second enclosed cooling volume being disposed adjacent to a respective one of the second heat generating electronic components; each of the second enclosed cooling volumes includes an interior space defined by an upper wall, a side wall that extends from the upper wall toward the respective second heat generating electronic component, and a bottom wall connected to an end of the side wall and positioned to be disposed adjacent to the respective second heat generating electronic component so as to be in heat exchange relationship therewith, the bottom wall is spaced from and generally parallel to the upper wall, and each of the second enclosed cooling volumes includes a cooling fluid inlet port and a cooling fluid exit port;
the second module cover further including:
an inlet port fluidly connected to the transfer outlet port of the first module cover;
an outlet port fluidly connected to the transfer inlet port of the first module cover;
a cooling fluid inlet header passageway fluidly connected to the inlet port of the second module cover and in simultaneous fluid communication with the cooling fluid inlet ports of the second enclosed cooling volumes; and
a cooling fluid outlet header passageway fluidly connected to the outlet port of the second module cover and in simultaneous fluid communication with the cooling fluid exits ports of the second enclosed cooling volumes.

16. The electronics module assembly of claim 15, wherein the cooling fluid inlet header passageway of each of the first and second module covers is parallel to the cooling fluid outlet header passageway thereof.

17. An electronics module assembly comprising:
a module having a first surface;
a plurality of heat generating electronic components on the first surface;
a module cover configured to cover the first surface of the module, the module cover includes a plurality of enclosed cooling volumes, each enclosed cooling volume being disposed adjacent to a respective one of the heat generating electronic components; each of the enclosed cooling volumes includes an interior space defined by an upper wall, a side wall that extends from the upper wall toward the respective heat generating electronic component, and a bottom wall connected to an end of the side wall and positioned to be disposed adjacent to the respective heat generating electronic component so as to be in heat exchange relationship therewith; the bottom wall is spaced from the upper wall; and each of the enclosed cooling volumes includes a cooling fluid inlet port and a cooling fluid exit port formed in the upper wall and in communication with the interior space thereof; and the enclosed cooling volumes are configured such that cooling fluid introduced into the enclosed cooling volumes does not directly contact the heat generating electronic components;
the module cover further including:
an inlet through which the cooling fluid can enter the module cover;
an outlet through which the cooling fluid can exit the module cover;
a cooling fluid parallel flow path formed on the upper wall in fluid communication with the inlet and the outlet for simultaneously directing cooling fluid to and from the enclosed cooling volumes, the cooling fluid parallel flow path includes a cooling fluid inlet header passageway fluidly connected to the inlet, cooling fluid inlet feed passageways extending from the cooling fluid inlet header passageway to the cooling fluid inlet ports of the enclosed cooling volumes to simultaneously feed cooling fluid to the cooling fluid inlet ports of the enclosed cooling volumes, a cooling fluid outlet header passageway fluidly connected to the outlet, and cooling fluid outlet feed passageways extending from the cooling fluid exit ports to the cooling fluid outlet header passageway to simultaneously feed cooling fluid from the cooling fluid exit ports to the cooling fluid outlet header passageway.

18. The electronics module assembly of claim 17, wherein the cooling fluid inlet header passageway is parallel to the cooling fluid outlet header passageway, the cooling fluid inlet feed passageways are parallel to at least a portion of the cooling fluid outlet feed passageways, and the cooling fluid inlet feed passageways and the portions of the cooling fluid outlet feed passageways are perpendicular to the cooling fluid inlet header passageway and the cooling fluid outlet header passageway.

19. The electronics module assembly of claim 17, wherein the inlet is at a first end of the module cover and the outlet is at a second end of the module cover opposite the first end, the cooling fluid parallel flow path further includes a first fluid passageway extending from the inlet to the cooling fluid inlet header passageway and a second fluid passageway extending from the outlet to the cooling fluid outlet header passageway, and the first fluid passageway is parallel to the second fluid passageway.

* * * * *